(12) United States Patent
Kumari et al.

(10) Patent No.: US 9,997,434 B2
(45) Date of Patent: Jun. 12, 2018

(54) SUBSTRATE SPRAYER

(71) Applicant: Hewlett Packard Enterprise Development LP, Houston, TX (US)

(72) Inventors: Niru Kumari, Palo Alto, CA (US); Tahir Cader, Spokane, WA (US); Sergio Escobar-Vargas, Palo Alto, CA (US); Cullen E. Bash, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days. days.

(21) Appl. No.: 15/311,569

(22) PCT Filed: May 19, 2014

(86) PCT No.: PCT/US2014/038569
§ 371 (c)(1),
(2) Date: Nov. 16, 2016

(87) PCT Pub. No.: WO2015/178880
PCT Pub. Date: Nov. 26, 2015

(65) Prior Publication Data
US 2017/0084514 A1   Mar. 23, 2017

(51) Int. Cl.
*H05K 7/20* (2006.01)
*H01L 23/473* (2006.01)
(Continued)

(52) U.S. Cl.
CPC ............ *H01L 23/427* (2013.01); *H01L 23/02* (2013.01); *H01L 23/34* (2013.01); *H01L 23/473* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
(Continued)

(56) References Cited

U.S. PATENT DOCUMENTS 5,220,804 A * 6/1993 Tilton ...................... B64G 1/50
                                                    257/E23.088
5,285,351 A * 2/1994 Ikeda .................... H01L 23/433
                                                    165/104.33
(Continued)

FOREIGN PATENT DOCUMENTS

CN     102027429 A    4/2011
JP     2014-065263 A  4/2014

OTHER PUBLICATIONS

PCT International Search Report, Written Opinion, Application No. PCT/US2014/038569 dated Feb. 13, 2105, 11 pages.
(Continued)

*Primary Examiner* — Anthony Haughton
*Assistant Examiner* — Razmeen Gafur
(74) *Attorney, Agent, or Firm* — Brooks, Cameron & Huebsch, PLLC

(57) ABSTRACT

An example device in accordance with an aspect of the present disclosure includes a substrate that may be disposed in a housing. The substrate includes a sprayer to spray coolant.

11 Claims, 7 Drawing Sheets

(51) Int. Cl.
  *H01L 23/427* (2006.01)
  *H01L 23/34* (2006.01)
  *H01L 25/065* (2006.01)
  *H01L 23/02* (2006.01)
  *H01L 25/18* (2006.01)
  *H01L 23/44* (2006.01)
  *H01L 23/467* (2006.01)
  *H01L 23/48* (2006.01)

(52) U.S. Cl.
  CPC ........ *H01L 23/4735* (2013.01); *H01L 25/065* (2013.01); *H01L 25/0657* (2013.01); *H01L 25/18* (2013.01); *H01L 23/44* (2013.01); *H01L 23/467* (2013.01); *H01L 23/481* (2013.01); *H01L 2225/06589* (2013.01); *H01L 2924/0002* (2013.01)

(58) Field of Classification Search
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | | |
|---|---|---|---|---|
| 5,349,499 A * | 9/1994 | Yamada | ................ | H01L 23/427 165/104.33 |
| 5,687,577 A * | 11/1997 | Ballard | ............... | H01L 23/4735 257/E23.1 |
| 6,108,201 A | 8/2000 | Tilton et al. | | |
| 6,650,542 B1 | 11/2003 | Chrysler et al. | | |
| 6,713,854 B1 * | 3/2004 | Kledzik | ................. | H05K 1/141 174/252 |
| 7,283,365 B2 | 10/2007 | Craft, Jr. | | |
| 7,310,230 B2 | 12/2007 | Tustaniwskyi et al. | | |
| 8,046,113 B2 | 10/2011 | Sharma et al. | | |
| 2001/0019913 A1 * | 9/2001 | Llapitan | .............. | H01L 23/4093 439/327 |
| 2002/0030972 A1 * | 3/2002 | Ali | ...................... | H01L 23/4006 361/704 |
| 2002/0113141 A1 | 8/2002 | Malone et al. | | |
| 2002/0113142 A1 * | 8/2002 | Patel | ................... | H01L 23/4735 239/128 |
| 2002/0152761 A1 * | 10/2002 | Patel | ......................... | G06F 1/20 62/259.2 |
| 2002/0163782 A1 * | 11/2002 | Cole | ..................... | F25B 39/028 361/700 |
| 2002/0181216 A1 * | 12/2002 | Kledzik | ................ | H01L 25/105 361/790 |
| 2004/0060313 A1 * | 4/2004 | Tilton | ....................... | F28D 5/00 62/259.2 |
| 2005/0185378 A1 * | 8/2005 | Tilton | ................ | H05K 7/20345 361/699 |
| 2005/0248921 A1 * | 11/2005 | Schmidt | ................ | H01L 23/473 361/698 |
| 2006/0023424 A1 * | 2/2006 | Nakamura | ......... | G01R 31/2875 361/699 |
| 2006/0026983 A1 * | 2/2006 | Tilton | ....................... | F28D 5/00 62/310 |
| 2006/0117765 A1 | 6/2006 | Bash et al. | | |
| 2007/0070605 A1 * | 3/2007 | Straznicky | .......... | H01L 23/4338 361/702 |
| 2007/0285892 A1 * | 12/2007 | Mindock | ............... | H01L 23/427 361/700 |
| 2009/0001909 A1 * | 1/2009 | Ward | ..................... | B60K 6/405 318/139 |
| 2009/0284921 A1 * | 11/2009 | Colgan | ................. | H01L 23/473 361/699 |
| 2011/0029153 A1 | 2/2011 | Shah | | |
| 2011/0085304 A1 * | 4/2011 | Bindrup | ............. | H01L 21/4871 361/718 |
| 2011/0304987 A1 | 12/2011 | Oprins et al. | | |
| 2012/0069523 A1 * | 3/2012 | Kapusta | ............... | H05K 1/0218 361/704 |
| 2015/0043168 A1 * | 2/2015 | Douglas | ................ | H01L 23/427 361/719 |
| 2016/0007505 A1 * | 1/2016 | Kim | ................... | H05K 7/20727 361/679.48 |
| 2016/0037671 A1 * | 2/2016 | Hsiao | ................... | H05K 7/1432 361/716 |

OTHER PUBLICATIONS

Wang, Q. et al., Low Latency Compute Node Architecture Cooled by a Two Phase Fluid Flow, ICEPT-HDP, 2012, 13th International Conference, Aug. 13-16, 2012, pp. 74 81.

* cited by examiner

SUBSTRATE SPRAYER

BACKGROUND

Thermal management of electronics, such as integrated circuit (IC) packages, may involve conduction of heat through the package to a heatsink attached to the package. Such thermal management also may involve power density limitations, in order to meet temperature requirements imposed on the package. Accordingly, performance and reliability of the package may be limited in view of attempting to meet heat and power limitations.

BRIEF DESCRIPTION OF THE DRAWINGS/FIGURES

DETAILED DESCRIPTION

Figure 1:
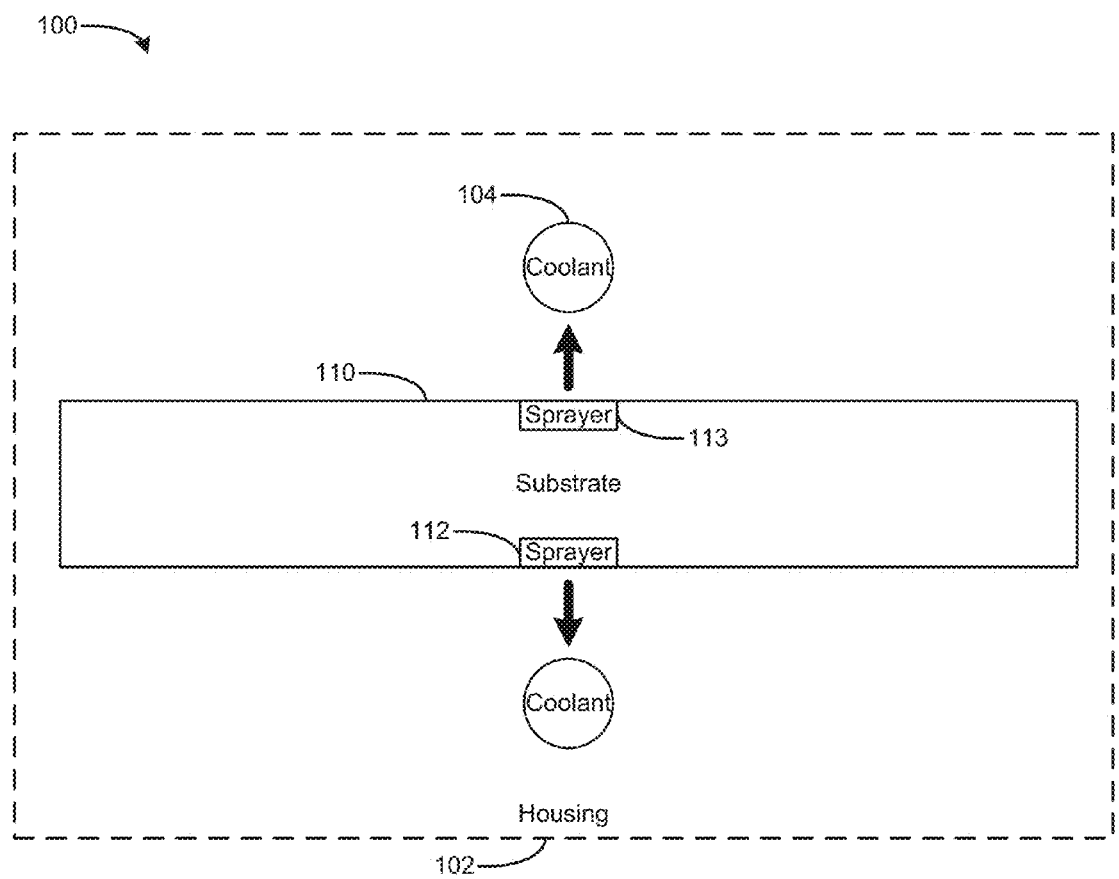
FIG. 1 is a side view block diagram of a device including a first sprayer and a second sprayer according to an example.

An IC package may include a single die or a three dimensional (3D) stacking of dies, that may include logic processors, dynamic random access memory (DRAM) dies, flash memory dies, non-volatile memory (NVM) dies (e.g. memristor dies), and so on. Dies may use through silicon vias (TSVs) in the IC packaging, e.g., to improve compute-to-memory bandwidth and latency between dies in the 3D stack. A logic processor die, which may be higher power in the 3D stack, may be positioned at the bottom of the stack to enhance the signal integrity of input/output (I/O) signals and power signals that are communicated into and out of the package bottom (e.g., for a surface mount package). However, the IC package may include a heatsink at the top of the package. Accordingly, physical distance and corresponding thermal resistance is increased between the heat sink cooling source and the logic processor and/or memory dies, which may result in reduced efficiency of heat dissipation for the package and associated die(s).

Examples provided herein provide a substrate for heat transfer (enabling cooling and/or heating), compatible with architectures such as 3D IC packages. For example, the substrate may be thin enough to be placed between dies, such as a logic processor and memory stack, in a 3D IC stack, to directly cool or heat the 3D IC with tailored coolant delivery to specific portions of specific dies. Example substrates enable applications associated with extreme temperatures, such as Performance Optimized Datacenters (PODs) deployed to extreme environments. Prior to power up, electronics may need to be warmed or cooled to be within operational parameters. The example substrates may pump coolant to cool and/or frictionally heat a die, to speed up a system start-up time, and may use additional components to heat and/or cool the coolant. Thus, the term "coolant" and related terminology ("cooling") should not be limited to cooling, and should be interpreted to be relevant to any form of heat transfer, such as heating and/or cooling solutions.

The substrate examples thereby may avoid large temperature gradients across a die (e.g., hot spots), and associated thermo-mechanical stresses that might result in package damage. Performance may be enhanced at a per-die level, down to a per-nozzle granularity, due to the cooling substrate having direct access to surfaces of the processor and other dies, and individual control over each nozzle. In addition to addressing such variations in spatial cooling needs, example substrates may address variations in temporal cooling needs. Accordingly, dies do not need to slow down via clock gating to avoid temperatures reaching maximum allowable limits, even in view of such thermal issues that otherwise may be particularly aggravated in 3D IC package solutions. Examples herein thereby avoid limitations on power density, and/or risk of higher temperature gradients across die(s), and higher temperature spikes at die/stack hot spots. Accordingly, examples provided herein may overcome limitations on a number of high power logic processors, or other dies, that may be packaged in the same 3D stack, regardless of a package power map or whether hot spots are aligned/misaligned between the dies. IC packages from any vendor may be provided with low thermal resistance and high heat dissipation capabilities, by adding the example cooling substrates, without a need to redesign dies and/or packages. Example cooling substrates may be integrated within packages at a chip-level (e.g., closed system), without a need to pipe coolant from an external system-level cooling infrastructure to the package, thereby reducing and/or eliminating a risk of coolant leakage issues.

FIG. 1 is a side view block diagram of a device 100 including a first sprayer 112 and a second sprayer 113 according to an example. The first sprayer 112 and second sprayer 113 are disposed at the substrate 110, to enable delivery of coolant 104 upward and downward. The substrate 110 may be disposed in a housing 102, such as an IC package.

The substrate 110 may be thin/compact, and may be integrated into a housing 102 of a 3D IC package for direct access to spraying coolant 104 onto heat sources (e.g., processing/memory dies). For example, a sprayer 112, 113 may be positioned to spray perpendicularly onto an opposing face of a die to be cooled, wherein the die is arranged parallel to the substrate 110 and perpendicularly to the direction of spray. The substrate 110 may be dimensioned similar to a die of an IC package, e.g., less than 1 mm in thickness. In an example, the substrate 110 may have a vertical thickness of approximately 700 microns. In an example, the substrate 100 is comprised of a silicon (Si) die, and the sprayers 112, 113 may be fabricated on/in the Si die. FIG. 1 illustrates a single substrate 110. However, multiple cooling substrates 110 may be integrated in 3D IC package, including being enclosed in a housing 102 as a closed system. Similarly, a plurality of first sprayers 112 and/or second sprayers 113 may be used. In an alternate example, the substrate 110 may include sprayer(s) on a single surface of the substrate 110, instead of both as illustrated in FIG. 1.

Furthermore, a plurality of sprayers 112, 113 may be disposed on a given surface of the substrate 110.

The sprayers 112 and 113 may spray coolant 104 as needed, whether upward or downward, or whether controlled to spray together or independently from each other. The sprayers 112, 113 may vary a frequency and/or a quantity of coolant 104 being delivered. A number and layout of sprayers 112, 113 disposed on the substrate 110 may be varied. Various nozzle spray patterns across the sprayer may be used, e.g., to provide a low temperature gradient across a die regardless of any hot spots the die may contain. In an example, coolant delivery provided by sprayers 112, 113 may be varied to match a power map of a die to be cooled. The coolant delivery may be varied based on a number/placement of sprayers, a layout pattern of sprayers, a spray pattern of a sprayer nozzle, a frequency of the sprayer, a droplet size provided by the sprayer, and other factors. For example, substrate 110 may include a regular distribution of sprayers 112 across its face, and those sprayers 112 facing a die hot spot may be controlled to spray more frequently than other sprayers 112 on the face of the substrate 110. Accordingly, device 100 enables precision coolant delivery directly to particular dies, and even at particular locations on a die(s). Furthermore, because sprayers 112, 113 may be individually controllable, the substrate 110 may adjust spray cooling patterns dynamically during use, e.g., in response to various environmental conditions (heat, vapor pressure, etc.) at a die to be cooled, including heat/electrical conditions at a die independent of environmental conditions.

The coolant 104 may be any type of fluid, such as electrically non-conducting liquid having appropriate thermal properties for heat transfer. The sprayer 113 is compatible with electrically conducting liquids such as water, and coolants 104 may include single-component liquids or multi-component mixtures of liquids associated with different respective boiling points. The coolant 104 may have properties, such as electrical non-conduction and boiling point(s), chosen according to the heat flux and electrical properties of the package to be cooled. In an example, the package may include exposed metal signal lines appropriate for an electrically non-conducting coolant 104.

The substrate 110 may be self-contained within a housing 102, embedded within layers of a 3D IC stack, enabling packaging flexibility and differentiation for an electronics package. Coolant 104 and coolant vapors may be contained within the housing 102, avoiding design complexities that may be associated with open designs. In an example, latent heat of vaporization of a two-phase coolant 104 may provide a cooling capacity on the order of approximately 4000 W/cm$^2$ for a closed IC package, which may depend in part on a type of coolant and/or substrate(s) used. Coolant may be circulated into and out of the substrate 110 and/or housing 102, and may rely on single-phase cooling or multi-phase cooling. Examples may use a reflux condenser or other heat exchanger (liquid- or vapor-based), enclosed within or externally coupled to the housing 102, to condense vapors of or otherwise cool and/or heat the coolant 104. In an alternate example, the substrate 110 may be used in conjunction with an open-loop cooling solution. The example substrate(s) 110 enable great flexibility in cooling solutions for a device(s) 100, whether single- or multi-phase cooling, open- or closed-loop cooling, internal or external (relative to housing 102) cooling, and/or other cooling solutions. Example devices may include a heating element (not shown) to heat the coolant, to thereby heat components of the device 100 such as a die for improving start-up times in extreme temperature conditions. Such a heater may be incorporated into the substrate 110, may be enclosed or external to the housing 102, and/or coupled to a controller (not shown) associated with the substrate 110.

Examples provided herein enable various advantages based on the exemplary cooling substrates. Lower junction-to-ambient thermal resistance of 3D IC packages enables higher power processors to be integrated in a 3D IC, in contrast to conduction-based IC packages or single-phase-based IC packages. This packaging enables two or more high power (e.g., logic processor) dies, and other (e.g., memory) dies to be packaged and directly cooled in the same housing 102. This enables higher computation rates while lowering latency of memory access. The sprayers 112, 113 may be finely controlled to meet dynamic power levels, e.g., to enable energy proportional computing. Thus, examples enable on-demand computing and/or cooling with a high degree of precision/accuracy. Spray patterns may be dynamically controlled over a heat source, to match a power map and enable a uniform temperature across a die while avoiding any hot spots. Accordingly, dies may be cooled without modifying packaging parameters or other considerations for an IC package (e.g., packaging profiles set up for conduction-based or other packaging arrangements). Accordingly, example devices enable packaging different kinds of dies available on the market, without a need to tailor the dies or their operational parameters, because the spray substrates may be customized to meet any needs. Example devices, including their spraying elements and coolant delivery channels/reservoirs (not shown in FIG. 1) may be fabricated on a substrate 110, such that fabrication may be aligned with existing IC fabrication processes to reduce implementation costs of the example devices.

Figure 2:
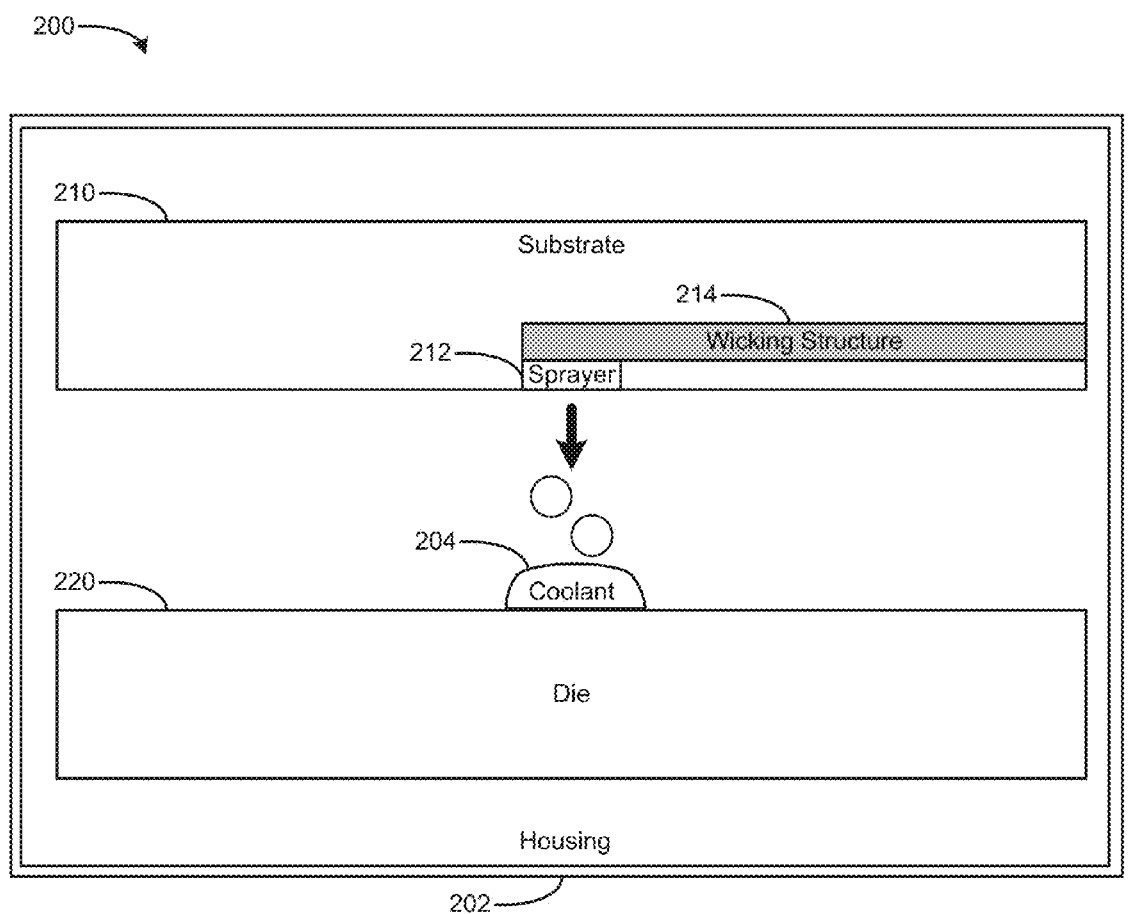
FIG. 2 is a side view block diagram of a device including a sprayer and a housing according to an example.

FIG. 2 is a side view block diagram of a device 200 including a sprayer 212 and a housing 202 according to an example. The device 200 includes a substrate 210 disposed in the housing 202, and a sprayer 212 disposed at the substrate 210 to spray coolant 204 onto the die 220. The substrate 210 also includes a wicking structure 214 coupled to the sprayer 212.

The sprayer 212 is positioned to spray small droplets (e.g., a droplet of several hundred picoliters in volume) of coolant 204 directly onto the logic or memory die 220. The droplets of coolant 204 evaporate, and the die 220 is cooled (e.g., based on the consumption of heat, according to the latent heat of vaporization, to convert the coolant from a liquid to a vapor). The coolant vapor is entrapped within the space of the housing 202, which may be e.g., an integrated heat spreader (IHS) for a die package.

The wicking structure 214 of the substrate 210 is to supply coolant 204 to the sprayer 212. In an example, the wicking structure 214 may collect coolant at a periphery of the substrate 210 (e.g., from a wall of the housing 202). The substrate 210 and wicking structure 214 are shown spaced from a wall of the housing 202. In an alternate example, these structures may be coupled together. The wicking structure 214 may include at least a portion of hydrophilic materials, and a geometry arrangement to be able to passively wick the coolant 204 through the wicking structure 214. In an example, the wicking structure 214 is a porous structure, having a thin horizontal arrangement parallel to the substrate 210. In an alternate example, the wicking structure 214 may be arranged such that gravity may assist in transfer of coolant 204 from an inlet of the wicking structure 214 to the sprayer 212. Thus, the wicking structure 214 may use a pattern/geometry for enhancing wicking (e.g., based on a thickness/orientation of the wicking channel), in addition to a type of material used to form the wicking structure 214. In an example, the wicking structure 214 may have a wicking channel that is on the order of tens of micrometers in height. The wicking structure 214 may be fabricated by reactive ion etching of SiO2 (or other material) to make it hydrophilic and/or porous, or by depositing some other porous material suitable for wicking, such as carbon nanotubes (CNT) at the wicking structure 214. The wicking structure 214 may utilize surface tension forces and/or capillary forces to self-pump the coolant 204 through the wicking structure 214, e.g., by drawing it off the wall of the housing 202 and delivering it to the sprayer 212.

The coolant 204 may be provided as a mixture of coolants (i.e., a mixture of two or more coolants having different boiling points), wherein the mixture may provide characteristics consistent with an effective boiling point tailored to the manufacturer's temperature specification for the die 220. Accordingly, the multi-phase cooling approach enables coolant to vaporize on the die 220 and maintain the die 220 at the desired temperature. In an example, the coolant 204 may be formed from a blend of multiple liquids to customize an effective boiling point. A first liquid having a 50 degree centigrade (C) boiling point may be mixed with a second liquid having a 70 C boiling point coolant, to achieve a 60 C effective boiling point. The mixture may be varied to tailor the desired effective boiling point of the coolant 204, for evaporating from the die 220 and preventing the die 220 from exceeding a desired temperature. More than two liquids may be mixed together. The effective boiling point may be chosen to be slightly greater than or less than a target temperature to be maintained at the die 220. In an example, the coolant 204 may include a portion that is to evaporate during transit between the sprayer 212 and die 220, to cool the droplet temperature prior to contact with the die 220, or otherwise affect conditions (e.g., to affect the vapor pressure in the vapor chamber formed by the housing 202).

The sprayer 212 may be arranged to directly spray onto the die 220. In an example, the sprayer 212 may be positioned at a distance of approximately 10-50 microns from the die 220. A droplet size of the coolant 204 also may be adjustable based on the sprayer nozzle diameter, sprayer frequency, sprayer voltage, liquid type/mixture of coolant 204, and other factors. A droplet may be sized on the order of approximately 1-10 micron(s). The drop velocity emerging from the sprayer 212 also may be varied in view of the factors above, and the velocity may be chosen to be relatively high to enable a desired amount of evaporation of the coolant 204 to take place when the coolant 204 is deposited on the die 220. However, properties of the coolant 204 may be chosen such that a portion of the coolant 204 is to evaporate while traveling to the die 220, e.g., to affect the temperature and/or mixture ratio of the drop of coolant 204.

The boiling point of the coolant 204 also may be affected by a pressure inside the housing 202, wherein the resulting boiling point of the coolant 204 may be increased or decreased according to a saturation curve for the coolant 204 experiencing the housing pressure. The closed system provided by housing 202 enables the sprayer 212 to change a firing pressure and firing frequency to control a dynamic cooling capacity of the package, wherein the coolant 204 and sprayer 212 may provide control over the pressure and/or boiling point. The sprayer 212 is flexible in its handling of various types of coolants 204, such that various types of mixtures are possible, while enabling the delivery of a liquid droplet of coolant 204 at the die 220 to take advantage of phase change cooling for those examples.

Figure 3:
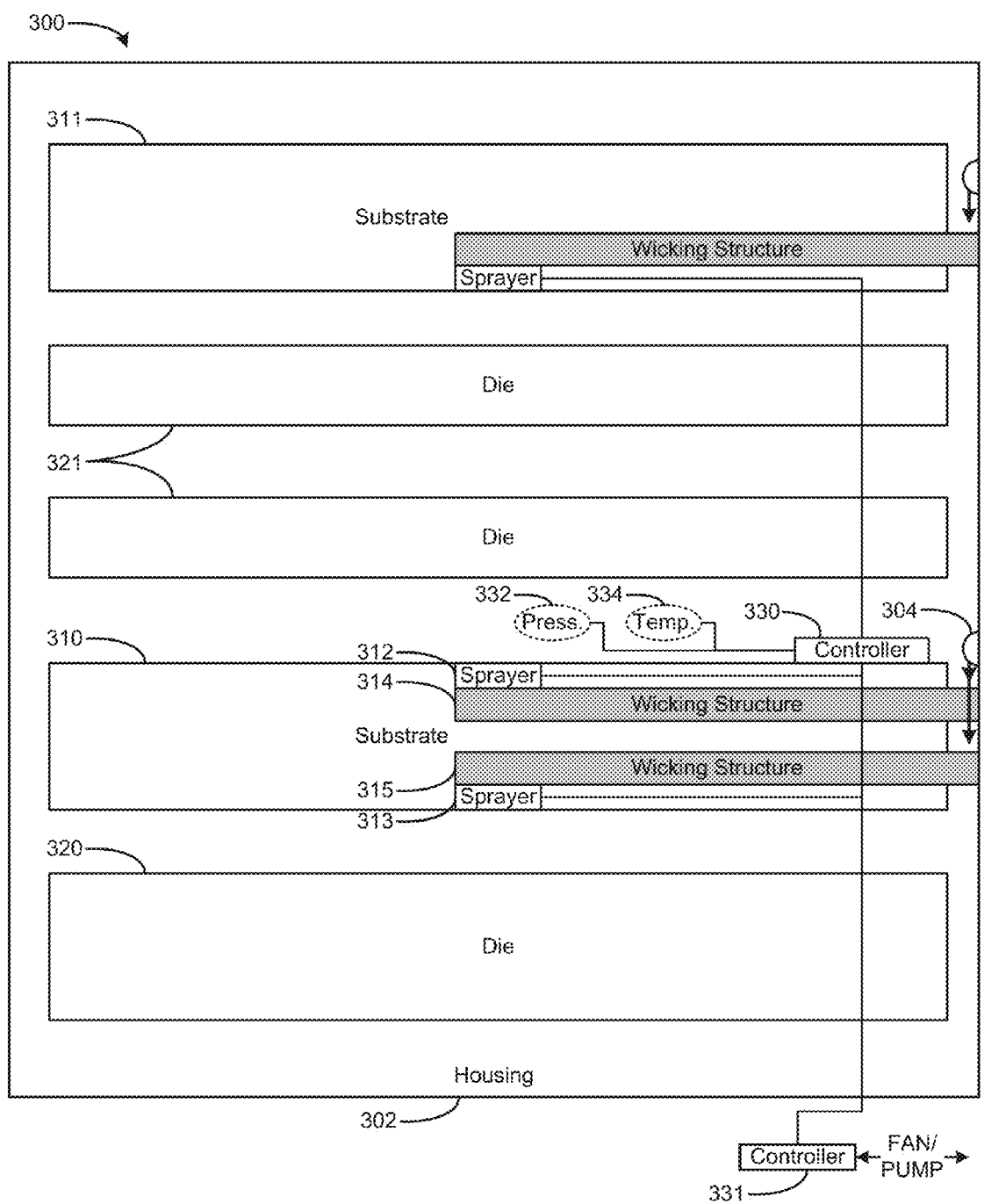
FIG. 3 is a side view block diagram of a device including a plurality of substrates and a plurality of dies according to an example.

FIG. 3 is a side view block diagram of a device 300 including a plurality of substrates 310, 311 and a plurality of dies 320, 321 according to an example. The first substrate 310 includes a first sprayer 312 and associated first wicking structure 314, a second sprayer 313 and associated wicking structure 315, and a first controller 330 and associated pressure sensor 332 and temperature sensor 334. The first and second wicking structures 314, 315 are coupled to the housing 302 to recover coolant 304, e.g., that has condensed on the housing 302 or is otherwise drawn into a wicking channel of the substrate (e.g., based on wicking of the wicking structure and/or pumping effects by the sprayer). Device 300 also includes a second controller 331, coupled to exchange information regarding a fan and/or pump signal, or other information (e.g., information regarding an operating system or processor such as operational parameters of a system on a chip (SOC)). In an alternate example, device 300 may include a single controller positioned inside or outside of the housing 302. Communications (e.g., with controller 330 and/or controller 331) may pass into and out of the housing 302 via couplings for the device 300, such as a ball grid array (BGA) at a base of the device 300 (not shown in FIG. 3). Alternatively, communications may be passed directly through a via in the housing 302.

The first and second substrates 310, 311 may be fabricated using semiconductor fabrication techniques. The sprayers 312, 313 may be fabricated on one or both sides of a substrate, to spray coolant 304 on dies 320, 321. For example, die 320 may comprise a high-power logic processor, and dies 321 may comprise a memory stack. The stack of dies 321 may be cooled by spraying on outer portions of the stack, and heat from non-sprayed portions of the dies 321 may be conducted through the stack to the sprayed portions. Because memory dies are relatively low-powered compared to logic processors, a temperature specification for the various dies can be easily met by using the substrates 310, 311 and external spraying of the die stack. Furthermore, multiple logic processors and memory stacks may be included in the device 300 without exceeding desired parameters. For example, additional cooling substrates may be used in the package device 300 to meet cooling capacity and thermal resistance parameters as needed. The cooling substrates may be located within the stack of dies 320, 321 to meet desired thermal characteristics of the package, because of the thin and self-contained nature of the substrate and its corresponding components, such as the wicking structure, sprayer, and even controller that may be incorporated with the substrate. Furthermore, the package may be enclosed by housing 302, forming a closed-loop wherein the coolant 304 is controllably sprayed, vaporized, and condensed inside the housing 302. In alternate examples, device 300 may use other arrangements, including open-loop systems and those arrangements that pass coolant into and/or out of the housing 302 (e.g., using an external heat exchanger).

The cooling capacity may be dynamically and/or automatically adjusted, based on the desired temperature characteristics of the dies 320, 321, and existing/dynamic/predicted power levels (e.g., power consumption by the dies 320, 321). The controller 330 is shown disposed on the first substrate 310, to achieve a chosen cooling capacity by controlling a flow rate of coolant 304 sprayed on the dies 320, 321. The coolant flow rate may be adjusted by the controller 330 locally, and/or by controller 331 externally (and/or via external signals) based on signals coupled to the first substrate 310. The firing frequency and/or voltage level may be varied at the sprayers 312, 313 under control of the controller(s) 330, 331 to adjust a droplet diameter of the sprayed coolant 304 and total coolant flow for a sprayer.

Spray control also may be based on signals associated with an external system fan and/or pump, e.g., received and sent by controller 331. For example, an external fan or water pump may deliver cooling to an exterior of the housing 302, thereby cooling the exterior of the housing 302. Controller 331 thereby may receive information regarding external water/air temperature exposed to the housing 302, flow rate of the external water/air, and so on. The fan/pump signal thereby may be used to control and/or balance a mass condensation rate at the housing 302 (e.g., an IHS) versus an evaporation rate of the coolant 304, by controlling conditions both inside and outside the device 300. Such signals also may be sent/received from a computing system motherboard/processor or other controller separate from device 300. Controller(s) 330, 331 may monitor the vapor pressure and temperature inside the housing 302 based on the pressure sensor 332 and temperature sensor 334. The sensors 332, 334 are depicted for convenience, but may be located at any position in/on device 300, in view of design choices/constraints of the package device 300.

The numbers and positions of the substrates 310, 311 and dies 320, 321 are shown for example, and are not so limited. A given design may be considered for how much cooling capacity would be needed, and the number of cooling substrates 310, 311 may be chosen to meet that cooling capacity. In an example, dies 320 may comprise high power logic processors that dissipate on the order of 100-200 Watts. The dies 321 may comprise low power memory dies that dissipate on the order of 50-100 Watts. A single cooling substrate 310 may be capable of dissipating on the order of 400 Watts, enough to match the total dissipation of this example. However, two or more cooler substrates may be embedded throughout the dies 320, 321, to provide beneficial distribution and targeted delivery of the coolant 304, even if one cooler substrate may have been sufficient in view of raw power dissipation capacity.

Controller(s) 330, 331 may be located on a cooling substrate 310, 311 where the sprayers 312, 313 are located. Alternatively, a controller 330, 331 may be located on a die 320, 321, on the housing 302, or anywhere that enables signals to be exchanged as needed (e.g., to the sprayers 312, 313 to spray the coolant 304; to/from the fan/pump signals, etc.). Signal couplings are shown leading between substrates, dies, and housing, and may be provided as inter-die vias and/or on-die/-housing traces, for example. A device 300 may omit a controller(s) 330, 331, which instead may be located separate from the device 300, wherein control signals may be passed through the housing 300 to the sprayers 312, 313. Device 300 may include multiple/additional controllers 330, 331 that communicate with each other, e.g., to coordinate external and/or internal cooling/status (fan/pump status, system status, die status, cooling substrate status) and internal spraying. Controllers 330, 331 may be integrated with a substrate 310 as an integrated circuit. In an alternate example, the controller(s) may be provided as separate/discrete circuits and/or chips, and may be provided as a basic signal coupling at a substrate, to pass received signals to the sprayers.

A controller 330, 331 may control the sprayers 312, 313 based upon, e.g., chamber vapor pressure (e.g., indicated by pressure sensor 332), coolant temperature (e.g., indicated by temperature sensor 334), power consumption (e.g., as consumed by dies 320, 321 and/or as communicated by those dies, a system on a chip (SOC), or even a separate computing system/operating system in communication with device 300). In response, controller 331 may send a command to increase/decrease an external fan/pump speed, and controller 330 may send a command to increase/decrease coolant spraying, and so on. The commands may be affected by a type of external cooling (e.g., whether air cooled or water cooled), and by a type of internal cooling (e.g., single-phase or multi-phase cooling).

In an example, a die 320 may be an SOC that includes an on-die SOC controller (not specifically shown), which controls power draw/consumption by the SOC die 320 according to requests for compute operations. The sprayer controller 330 may coordinate with such an SOC controller, and/or an operating system that coordinates with the SOC controller. This enables the controller 330 to predictively increase or decrease operation of sprayers 312, 313 independently of the sensed environmental conditions, according to the expected heat increase/decrease of the SOC die 320 in view of the compute operations expected to be run on the SOC die 320. Thus, cooling provided by substrates 310, 311 may ramp up (or down) prior to and independent of changes in environmental conditions of the device 300.

Figure 4:
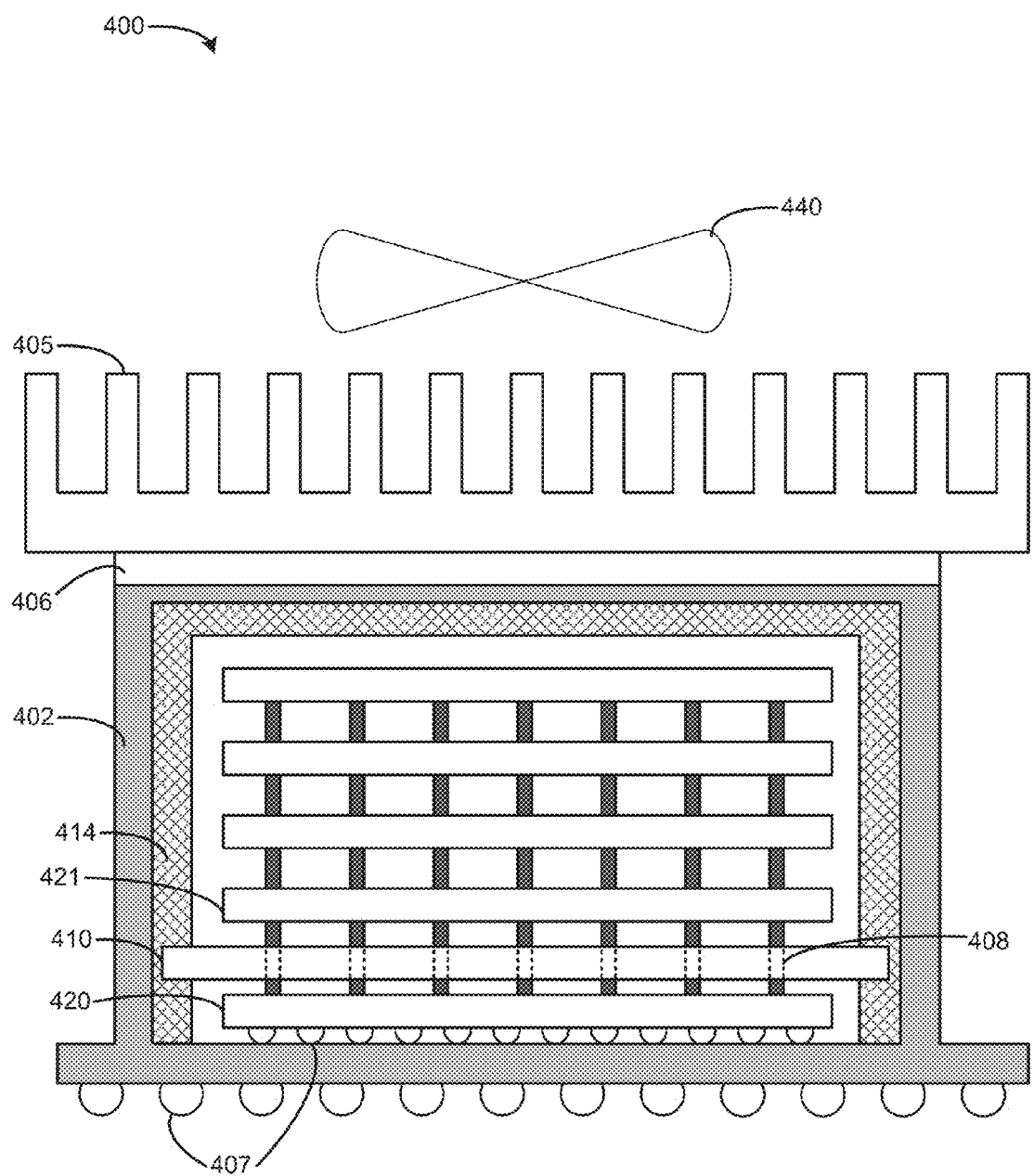
FIG. 4 is a side view block diagram of a device including a substrate and a plurality of dies according to an example.

FIG. 4 is a side view block diagram of a device 400 including a substrate 410 and a plurality of dies 420, 421 according to an example. Heatsink 405 is coupled to the housing 402 via thermal interface 406 and is to receive external cooling 440 (e.g., a fan/pump). A wicking structure 414 is coupled to the housing 402, to communicate recovered coolant to the cooling substrate 410. The substrate 410 includes vias 408, enabling couplings between dies 420, 421 to pass through the cooling substrate 410. The housing 402 and/or die 420 may be coupled to each other and to external structures/communications based on ball grid array (BGA) 407.

Device 400 illustrates a 3D IC stack of dies 420, 421 including a cooling substrate 410 within the closed package device 400. The cooling substrate 410 is positioned to spray coolant onto the logic processor die 420 and the first memory die 421 as needed.

Heatsink 405 may be externally air-cooled or liquid cooled, transferring the external cooling effect to the housing 402 to affect the environment of the coolant within the housing 402. A controller of device 400 (e.g., inside the housing 402, or external to the housing 402) may control the speed/rate of external cooling 440, e.g., in view of conditions in the housing 402. In an alternate example, the external cooling 440 (and/or heatsink 405) may be omitted. Communications to/from components inside the housing 402 (associated with controllers, dies, vias, and so on) may be passed through the housing 402 by using BGA 407. Thus, substrate 410, and associated controllers of substrate 410, may be controlled via signaling passed through BGA 407, enabling integration of control signaling for the device 400. In an alternate example, communication lines (and other lines, such as coolant lines) may pass directly through the housing 402, e.g., using a sealed coupling compatible with a type of cooling solution used by device 400.

The housing 402 may be an integrated heat spreader (IHS) that is sidelined with the wicking structure 414. The housing 402 may provide a vapor space, between internal components of device 400 and the wicking structure 414. Housing 402 may be coupled to an underlying substrate having solder bumps for attaching the package device 400 to a printed circuit board (PCB) such as a motherboard.

The first die 420 is enclosed by the housing 402, and may be a high power die such as a logic processor. The first die 420 may include solder bumps (BGA 407) and underfill, for signal communication and mounting the first die 420 to the underlying housing substrate. The first die 420 maybe coupled to second dies 421, based on signal lines passing through vias 408 of the substrate 410 (or passing around an edge(s) of the substrate 410). The signal lines may carry signals such as input/output (I/O) and power between dies, as well as signals for the substrate 410 such as environmental and/or spray controller information). In an example, the second dies 421 may be a memory stack of low-power dies, providing storage for the first die 420.

The signal lines between the dies 420, 421 may be exposed electrical lines, such that the spray coolant may be electrically non-conducting to avoid interfering/shorting the lines. In an alternate example, the coolant may be electrically conducting (e.g., water), and various electrical components of device 400 may be sealed off (e.g., using o-rings to isolate metal portions from non-metal portions, such as by exposing a silicon die to the fluid and sealing off its metal contacts) or otherwise insulated to prevent the conducting fluid from contacting electrical elements such as the signal lines (e.g., by adding a passivation/dielectric layer to electrical components).

During operation, the externally cooled IHS housing 402 may condense vaporized coolant into a fluid on the relatively cool inner surface of the housing 402. The liquid coolant is recycled to the sprayers of the spray substrate 410 by utilizing the wicking structure 414 that may be coupled to walls of the housing 402. The wicking structure 414 feeds the liquid coolant into the cooling substrate 410, e.g., via a substrate/die channel in the substrate 410 that also includes a substrate wicking structure coupled between the housing wicking structure and the substrate sprayers. A porosity and geometric arrangement of the wicking structure 414 enables variation in wicking operation. Wicking performance may be designed to match the coolant properties, depending on the coolant itself (e.g., evaporation rate), and a desired flow rate to be provided by a sprayer fed by the wicking structure. The wicking structure 414 is shown in contact with the cooling substrate 410 in FIG. 4. However, in alternate examples, the wicking structure 414 may be spaced from the cooling substrate 410. The wicking structure 414 thereby may provide liquid coolant to enable the cooling substrate 410 to spray coolant and drastically reduce a thermal resistance of the package device 400. In an alternate example, the wicking structure 414 may be replaced and/or augmented with an inlet and outlet for coolant provided by an external heat exchanger.

The substrate 410 may include an integrated heat conductor (not shown), such as a heatsink/heatpipe. The integrated heat conductor may communicate thermally with housing 402. In an example, the heat conductor may be integrated as a heat conducting layer disposed on/inside the cooling substrate 410, such as copper, aluminum, etc.

Vias 408 are illustrated corresponding to the signal lines between dies 420, 421. In an alternate example, a cooling via may be provided as a vertical channel independent of signal lines. The cooling via may include a wicking structure in the via, to transport liquid coolant into, and even through, the substrate 410. In an example, a cooling via may transport liquid coolant, e.g., that has condensed on a surface of the substrate 410, into a sprayer or sprayer reservoir disposed in the substrate 410. The cooling via may include a reservoir for collecting coolant. The existing vias 408 also may serve as cooling vias, by surround a via 408 with a corresponding wicking structure, enabling the via 408 to pass both the signal lines and coolant through/within the substrate 410.

Figure 5A:
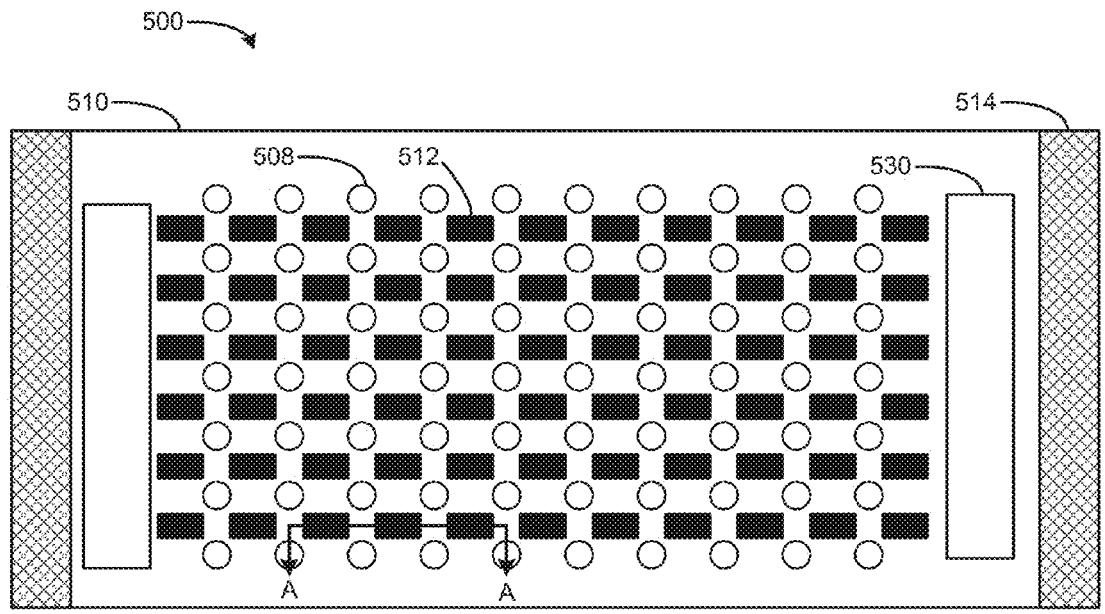
FIG. 5A is a top view block diagram of a device including a substrate and a plurality of sprayers according to an example.

FIG. 5A is a top view block diagram of a device 500 including a substrate 510 and a plurality of sprayers 512 according to an example. The substrate 510 also includes a plurality of vias 508, controllers 530, and wicking structures 514.

The vias 508 may be through silicon vias (TSVs) connecting one or more logic processor(s) to one or more memory die(s)/stack(s). The vias 508 also may include wicking vias, that may be in fluid communication with underlying the wicking structures/reservoirs. The controllers 530 may be spray control circuitry for operating the sprayers 512, e.g., to control a firing frequency and/or velocity/voltage of the sprayers 508. The wicking structures 514 may be arranged to collect coolant from sidewalls of an IHS housing of a device package (and/or from a surface of the substrate 510), and pass the collected coolant into coolant passages within the substrate 510. Coolant reservoirs (not visible in FIG. 5A) may be included in the substrate 510, along the coolant delivery path to the sprayers 512.

Figure 5B:
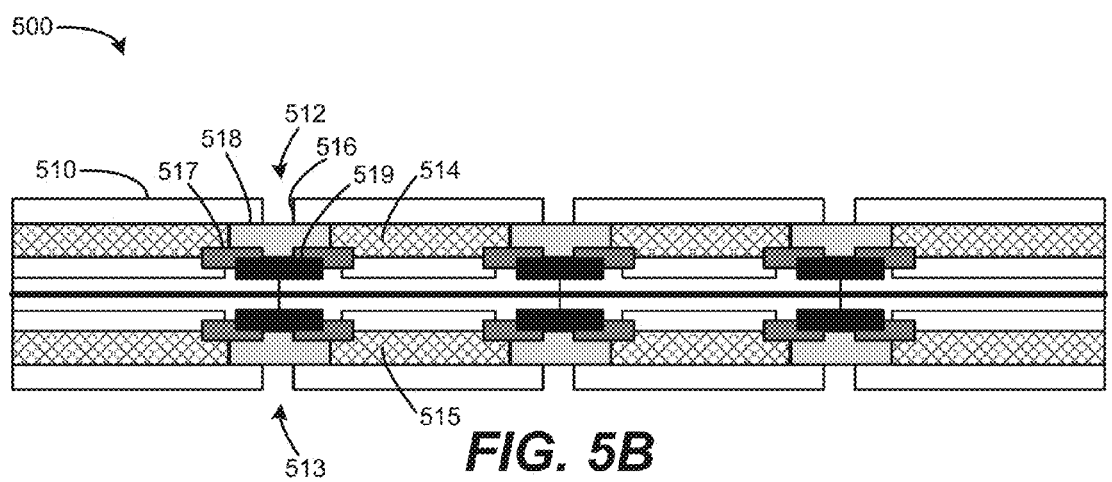
FIG. 5B is a sectional side view block diagram, along line A-A of FIG. 5A, of a device including a substrate and a plurality of sprayers according to an example.

FIG. 5B is a sectional side view block diagram, along line A-A of FIG. 5A, of a device 500 including a substrate 510 and a plurality of sprayers 512, 513 according to an example. The substrate 510 illustrates upward and downward sets of sprayers and associated components. The first and second sprayers 512, 513 are associated, respectively, with corresponding first and second wicking structures 514, 515 and coolant reservoirs 518 for coolant delivery. Sprayer 512 may include a nozzle 516, electrodes 517 (which may be electrically coupled to a controller 530 of FIG. 5A or other external controller), and pump 519.

The substrate 510 may include an outer substrate layer, which may be formed as an organic thin layer of SiO2 or other suitable material that is grown or deposited to seal off the underlying coolant/wicking structures (that may have been grown/fabricated in earlier stages). SiO2 or some other insulating layer also may be used to provide insulation between the top electrode 517, and the core Si die and metal layer/signal lines. The substrate 510 is shown as a mirrored layout, having first sprayers 512 pointing up and second sprayers 513 pointing down. The upper and lower portions may be separated by a core separator such as a silicon die core, onto which the components are fabricated. The outer portion of the substrate 510 may be formed as part of the sprayer 512, e.g., including features to form a nozzle or other aspect according to design parameters and desired droplet size.

The electrode 517 may form part of a MEMS sprayer structure, e.g., a piezo-based pump 519 using a piezo-crystal that physically distorts to pump coolant from the reservoir 518, such as liquid coolants associated with single-phase or multi-phase cooling. Alternatively, the pump 519 may be a thermal-based pump 519, e.g., associated with creating a bubble of vapor, based on heating a liquid coolant, to propel overlying liquid staged in the reservoir 518. Thus, the sprayers 512, 513 may be based on thermally-assisted jets, piezo-crystals, or other techniques for ejecting liquid droplets of coolant in a controllable manner. In an example, the sprayers 512, 513 may be based on thermally-assisted inkjet technology or piezo-crystal spraying inkjet technology as used in inkjet printers.

The coolant reservoir 518 may include a volume capacity sufficient to form liquid droplets, in view of enabling the sprayer to maintain a desired coolant flow rate (e.g., a continuous mode of high-frequency spraying, as suited to the package application) according to design parameters and cooling capacity/dies to be cooled. Capacity of the coolant reservoir 518 may be designed in conjunction with the wicking structure 514, which also may affect the reservoir 518 characteristics in view of collecting sufficient coolant from the wicking structure 514.

The physical layout of wicking structures 514, 515 and wicking channels, and reservoirs 518, may be varied as desired. FIG. 5B illustrates one reservoir 518 linked on left and right sides to corresponding horizontal wicking structures 514 approximately equal in height with the reservoir 518. However, additional channels/links of wicking structure 514 may be provided, to provide branching wicking channels that may crisscross each other, feed reservoirs vertically or horizontally, or at any angle. Physical arrangement may incorporate gravity feed to assist the wicking operation, and channels/reservoirs may be thicker or thinner than the illustrated example.

In an alternate example, the various sprayers may share components. A single pump 519 may be coupled to the upper and lower reservoirs 518, to operate both the upper and lower sprayers 512, 513, thereby spraying from the top and bottom of the substrate 510 at the same time, instead of the independently controllable arrangement as illustrated in FIG. 5B.

Figure 6A:
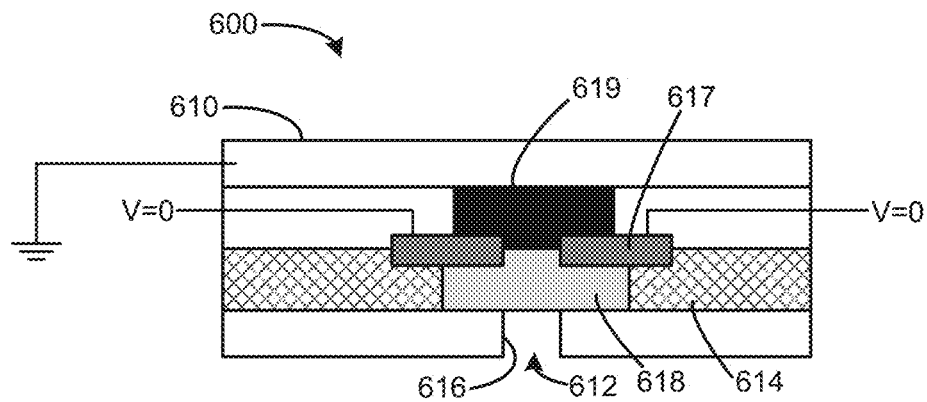
FIG. 6A is a side view block diagram of a device including a substrate and a sprayer according to an example.
Figure 6B:
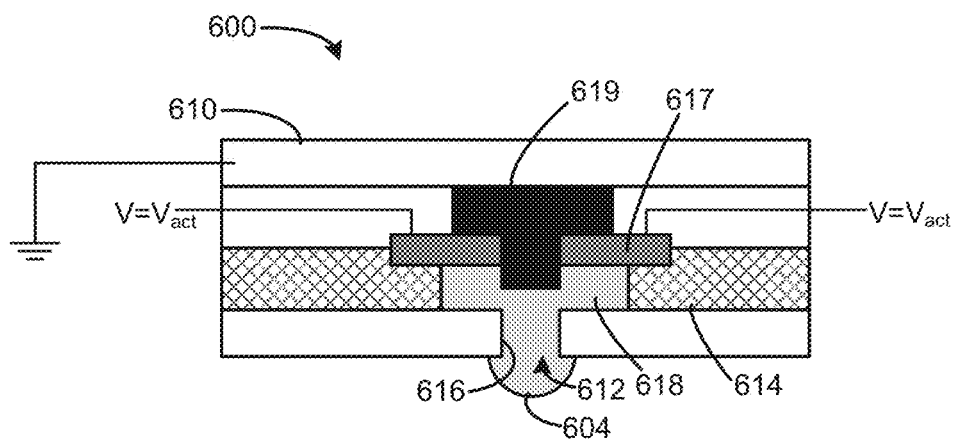
FIG. 6B is a side view block diagram of a device including a substrate and a sprayer according to an example.
Figure 6C:
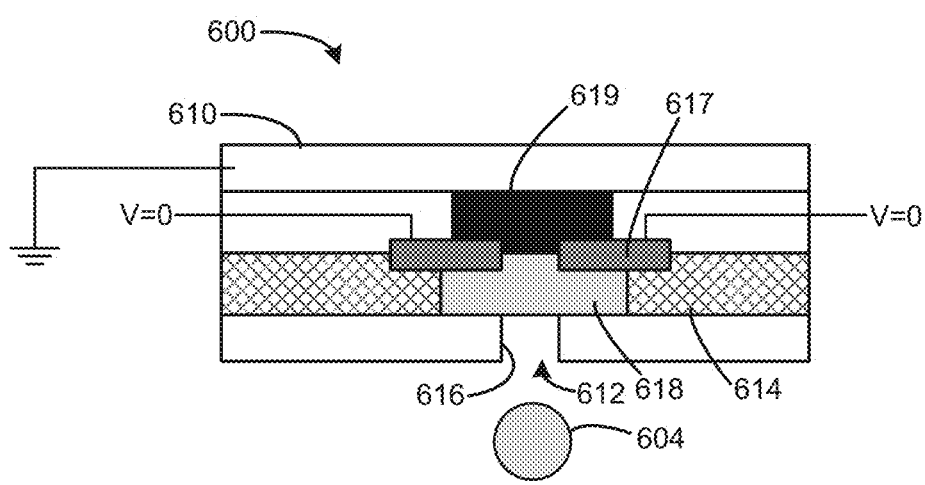
FIG. 6C is a side view block diagram of a device including a substrate and a sprayer according to an example.

FIGS. 6A-6C show a working concept of a piezo-crystal pump 619 used in a sprayer 612 to form droplets of coolant 604. FIG. 6A is a side view block diagram of a device 600 including a substrate 610 and a sprayer 612 according to an example. The sprayer 612 includes a nozzle 616, reservoir 618, wicking structures 614, electrodes 617, and pump 619.

The substrate 610 (e.g., a doped conducting silicon die) is grounded, and electrodes 617 are provided with an initial condition of zero voltage (V=0). Thus, no voltage difference is applied across the pump 619 (e.g., piezo-crystal). Accordingly, the piezo-crystal is not expanded, and does not displace coolant from the reservoir 618.

FIG. 6B is a side view block diagram of a device 600 including a substrate 610 and a sprayer 612 according to an example. The top electrode 617 has been energized, based on an activation voltage (V=Vact) applied to the electrode 617. The substrate 610 remains grounded, so the voltage Vact is applied across the piezo-crystal pump 619, resulting in an expansion of the piezo-crystal thickness. The expanded pump 619 pushes coolant out of the nozzle 616 of the sprayer 612. In an alternate example, the pump 619 may be a heating element that vaporizes a portion of the coolant in the reservoir 618, forming a bubble to push out the coolant 604.

FIG. 6C is a side view block diagram of a device 600 including a substrate 610 and a sprayer 612 according to an example. The voltage difference across the pump 619 has been removed, based on the substrate 610 being grounded and the applied voltage being zero (V=0). This relaxing of pump 619 causes a release/ejection of the droplet of coolant 604. Reducing the top electrode 617 to 0 V causes contraction of the piezo-crystal pump 619, forming the droplet. The application of voltage may be varied at a high frequency to generate a spray of droplets (e.g., switching between the conditions shown in FIGS. 6B and 6C at a desired frequency). The droplet is imparted a velocity and droplet size based on various controllable characteristics, such as the voltage magnitude and frequency of voltage change applied to the electrodes 617, which propels the droplet downward or upward based on the orientation of the sprayer nozzle 616. Other characteristics, such as non-electrical characteristics including nozzle size/shape, reservoir size, pump size, wicking structure size, and so on also may affect the droplet size and/or velocity, to provide the desired pumping characteristics.

Figure 7:
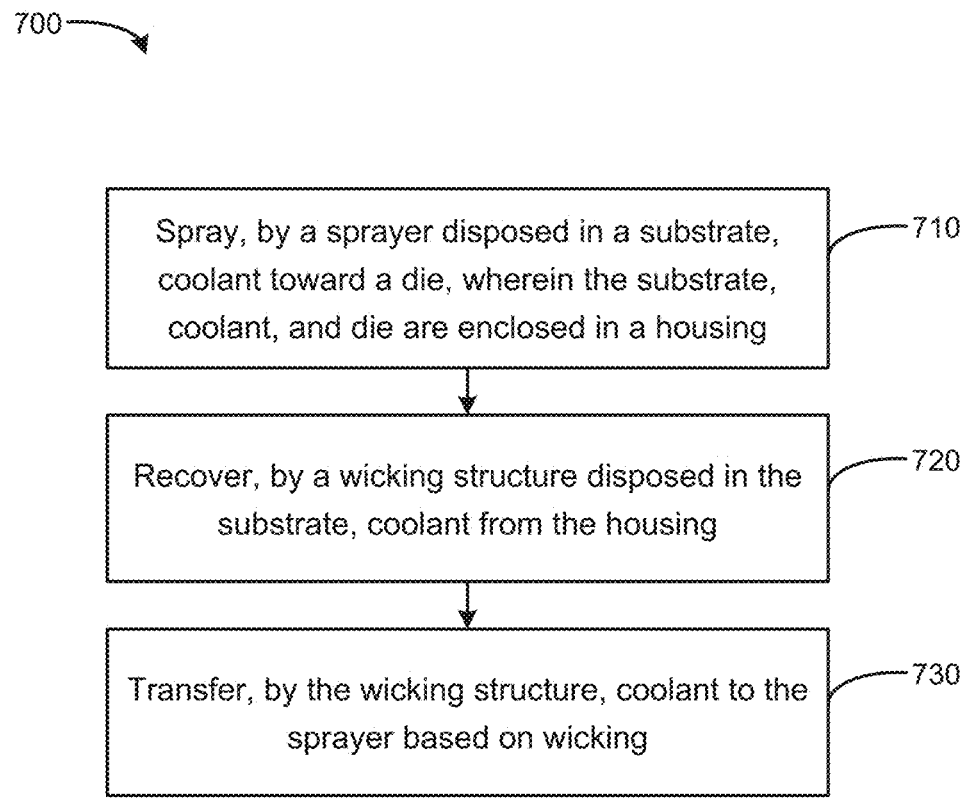
FIG. 7 is a flow chart based on spraying coolant toward a die according to an example.

Referring to FIG. 7, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 7 is a flow chart 700 based on spraying coolant toward a die according to an example. In block 710, a sprayer disposed in a substrate is to spray coolant toward a die, wherein the substrate, coolant, and die are enclosed in a housing. For example, the sprayer may include a controllable pump that produces a coolant droplet from a sprayer reservoir. In block 720, a wicking structure disposed in the substrate is to recover coolant from the housing. For example, the cooling substrate may include a substrate wicking structure and channel that is coupled to a side of the housing to collect fluid that has condensed on a wall of the housing. In block 730, the wicking structure is to passively transfer coolant to the sprayer based on wicking. For example, an inner surface of the housing may include a housing wicking structure that passes coolant to the substrate wicking structure, that is coupled to a sprayer reservoir in the cooling substrate. The wicking structures may transport coolant based on wicking, in accordance with factors such as surface tension, capillary action, and other fluid interaction in view of the wicking structure and geometry/arrangement/orientation (e.g., eventual orientation with respect to gravity).

What is claimed is:

1. A device comprising:
   a substrate insertable in a housing between dies of a three dimensional integrated circuit package;
   a first sprayer disposed in the substrate to spray coolant from a first surface of the substrate;
   a second sprayer disposed in the substrate to spray coolant from a second surface of the substrate opposite the first surface; and
   a wicking structure to passively transfer coolant to at least one of the first sprayer and the second sprayer based on wicking.

2. The device of claim 1, further comprising a controller disposed at the substrate and electrically coupled to the first sprayer and the second sprayer to control coolant delivery of the first sprayer and second sprayer.

3. The device of claim 1, wherein the wicking structure includes a porous hydrophilic wicking structure.

4. The device of claim 1, wherein the wicking structure includes a coolant reservoir coupled to at least one of the first sprayer and the second sprayer.

5. A device comprising:
   a housing;
   a first die and a second die disposed in the housing;
   coolant sealed in the housing; and
   a substrate disposed in the housing, the including:
      a sprayer to spray the coolant toward the die,
      a wicking structure to recover coolant from the housing and passively transfer coolant to the sprayer based on wicking; and
      a via to pass a connection from the first die though the substrate to the second die.

6. The device of claim 5, wherein the first die is a logic first die, and wherein the second die is a memory second die.

7. The device of claim 5, wherein the device comprises a plurality of substrates disposed throughout the housing to spray coolant on a face of a die.

8. The device of claim 5, further comprising a controller to identify a vapor pressure in the housing, and control coolant delivery to adjust the vapor pressure to achieve a desired coolant boiling point.

9. The device of claim 5, wherein the coolant comprises a mixture of a plurality of fluids, wherein the mixture is associated with an effective boiling point for heat transfer that differs from individual boiling points of the plurality of fluids.

10. The device of claim 5, wherein the controller is to control coolant delivery based on external cooling of the housing.

11. A method, comprising:
  identifying, by a controller coupled to the sprayer, a vapor pressure in a housing; and controlling, by the controller, coolant delivery to achieve a target vapor pressure and desired coolant boiling point;
  spraying, by a sprayer disposed in a substrate, coolant toward a die at given firing pressure and firing frequency to realize the target vapor pressure and desired coolant boiling point, wherein the substrate, coolant, and die are enclosed in a housing;
  recovering, by a wicking structure disposed in the substrate, coolant from the housing; and
  transferring passively, by the wicking structure, coolant to the sprayer based on wicking.

* * * * *